(12) United States Patent
Knox et al.

(10) Patent No.: US 9,176,184 B2
(45) Date of Patent: Nov. 3, 2015

(54) SEMICONDUCTOR DEVICE BURN-IN STRESS METHOD AND SYSTEM

(71) Applicant: International Business Machines Corporation, Armonk, NY (US)

(72) Inventors: Mark D. Knox, Hinesburg, VT (US); Kirk D. Peterson, Jericho, VT (US); Esuasi K. Segbefia, Williston, VT (US)

(73) Assignee: GLOBALFOUNDRIES U.S. 2 LLC, Hopewell Junction, NY (US)

( * ) Notice: Subject to any disclaimer, the term of this patent is extended or adjusted under 35 U.S.C. 154(b) by 107 days.

(21) Appl. No.: 14/045,455

(22) Filed: Oct. 3, 2013

(65) Prior Publication Data

US 2015/0100939 A1     Apr. 9, 2015

(51) Int. Cl.
*G06F 17/50* (2006.01)
*G01R 31/28* (2006.01)

(52) U.S. Cl.
CPC .......... *G01R 31/2848* (2013.01); *G01R 31/287* (2013.01)

(58) Field of Classification Search
CPC ............. G01R 31/2863; G01R 31/287; H01L 21/67098
USPC ........................................................ 716/136
See application file for complete search history.

(56) References Cited

U.S. PATENT DOCUMENTS

| | | | | |
|---|---|---|---|---|
| 4,947,545 A * | 8/1990 | Gussman | | 29/705 |
| 5,093,982 A * | 3/1992 | Gussman | | 29/705 |
| 5,327,075 A * | 7/1994 | Hashinaga et al. | | 324/750.07 |
| 6,175,812 B1 * | 1/2001 | Boyington et al. | | 702/118 |
| 6,455,336 B1 | 9/2002 | Berndlmaier et al. | | |
| 6,462,574 B1 | 10/2002 | Izuru et al. | | |
| 6,523,150 B1 | 2/2003 | Buffet et al. | | |
| 6,577,146 B2 * | 6/2003 | Gamache et al. | | 324/750.05 |
| 7,000,162 B2 | 2/2006 | Bernstein et al. | | |
| 7,129,735 B2 | 10/2006 | Subramaniam et al. | | |
| 7,428,675 B2 | 9/2008 | Gattiker et al. | | |
| 2002/0175694 A1 * | 11/2002 | Gamache et al. | | 324/760 |
| 2006/0002161 A1 * | 1/2006 | Dangelo et al. | | 363/147 |
| 2008/0284459 A1 | 11/2008 | Gattiker et al. | | |
| 2013/0173970 A1 * | 7/2013 | Kleveland et al. | | 714/710 |

OTHER PUBLICATIONS

Lackey et al., "Managing Power and Performance for System-on-Chip Designs using Voltage Islands", Proc. International Conf. on Computer aided design, 2002, pp. 721-725.
Vassighi et al., "CMOS IC Technology Scaling and Its Impact on Burn-In", IEEE Transactions on Device and Materials Reliability, vol. 4, No. 2, pp. 208-221,(2004).
Semenov et al., "Effect of CMOS Technology Scaling on Thermal Management During Burn-In", IEEE Transactions on Semiconductor Manufacturing, vol. 16, # 4, pp. 686-695, (2003).
Ravikumar et al., "Test strategies for low power devices", Proceedings of the IEEE Conference on Design Automation and Test in Europe, pp. 728-733 (2008), Munich, Germany.

* cited by examiner

*Primary Examiner* — Suchin Parihar
(74) *Attorney, Agent, or Firm* — Michael LeStrange; Hoffman Warnick LLC

(57) ABSTRACT

Burn-in (BI) stress using stress patterns with pin-specific power characteristics. A control device for each conductive pathway from BI board (BIB) contacts to device under test (DUT) connectors/contacts can adjust power delivered to a respective connector/contact responsive to a controller. The control devices can be included in the BIB or an interposer (IP) can be used with existing equipment. Each control device can include a regulator, such as a latchable array of field effect transistors that can regulate power delivered to a respective package connector.

17 Claims, 10 Drawing Sheets

SEMICONDUCTOR DEVICE BURN-IN STRESS METHOD AND SYSTEM

BACKGROUND

The invention relates generally to semiconductor devices and systems using such devices, particularly to improving effectiveness of burn-in stress testing thereof.

As part of semiconductor device manufacture, devices are subjected to burn-in (BI) stress to induce failure that would otherwise occur within a relatively short time period after an end user started operating the device. A typical BI stress test can use package connectors of a device under test (DUT) to apply power at higher voltage and/or current than those for which the DUT was designed, which can also elevate DUT temperature. As a result of the high voltage, current, power, and/or temperature, electromigration-related and other defects can occur in a matter of hours as opposed to days or longer during normal operation, avoiding shipping of a device that would likely have failed prematurely in the field. However, typical BI tests can create higher current densities than portions of the DUT should experience, particularly in the case of controlled collapsed chip connectors (C4s), which can create new defects, such as due to electromigration.

SUMMARY

Embodiments of the invention can take the form of a semiconductor device burn-in (BI) stress computer program product stored on a non-transitory computer readable storage medium including instructions in the form of executable computer code that when executed by a computing device configure the computing device to perform a method in which a semiconductor device under test (DUT) can be virtually divided into a plurality of tiles, a BI board (BIB) can be provided with a plurality of BIB contacts each configured to deliver power to a respective tile, and a control structure can be provided that has a plurality of control devices each configured to alter power delivered to a respective tile. Power can be delivered to the BIB contacts according to a BI pattern, each BIB contact being in electrical communication with a respective tile via a respective control device, a BI stress parameter value and maximum allowable value thereof can be determined for each tile, and the BI stress parameter values and respective maximum allowable values can be compared. Responsive to a BI stress parameter value exceeding the respective maximum allowable value, the control structure can be adjusted to reduce the BI stress parameter value, and the determining and comparing of the BI stress parameter values can be repeated.

Other embodiments of the invention disclosed herein can take the form of a semiconductor device burn-in (BI) stress system with a controller that includes a computing device and a non-transitory computer readable storage medium in communication with the computing device. A burn-in board (BIB) can be provided that can include a plurality of BIB contacts each arranged to provide power from a power source to a respective contact of a semiconductor device under test (DUT) responsive to the controller. A control structure can include a plurality of control devices each arranged to adjust power received at a respective DUT contact responsive to the controller. A computer program product can include instructions on the non-transitory computer readable storage medium in the form of computer executable code that when executed by the computing device configures the computing device to deliver power to the DUT with the BIB according to a BI pattern, determine a BI stress parameter value and allowable range thereof for each tile, and to identify any tile with a BI stress parameter value outside of the respective allowable range as a deviant tile. Responsive to a deviant tile having been identified, the control structure can be adjusted such that the respective BI stress parameter can be at least closer to the respective allowable range, and the delivering of the power, the virtually dividing of the DUT, the determining of the BI stress parameter values, the identifying, and the respective action responsive to the identifying can be repeated.

Further embodiments of the invention disclosed herein can take the form of a semiconductor device burn-in (BI) stress design structure configured for inclusion in a device under test (DUT) and readable by a machine used in design, manufacture, or simulation of an integrated circuit. The design structure can include a plurality of input contacts each configured for electrical communication with a respective contact of a burn-in board (BIB) arranged to provide power to the BIB contact responsive to a controller. A control structure of the design structure can have a plurality of control devices each between a respective input contact and a respective DUT contact and configured to adjust power received at the respective input contact to an adjusted value at the respective DUT contact responsive to a computing device. A non-transitory computer readable storage medium can be configured for communication with the computing device and can include a computer program product with instructions in the form of computer executable code. When the computer executable code is executed by the computing device, the computing device can be configured to configure the BIB to provide power to the DUT according to a BI pattern, to virtually divide the DUT into a plurality of tiles each associated with a respective BIB contact and a respective control device for each tile. A BI stress parameter value and an allowable range thereof can be determined for each tile, and any tile with a BI stress parameter value outside of the respective allowable range can be identified as a deviant tile. Responsive to a deviant tile having been identified, the control structure can be adjusted such that the BI stress parameter of any deviant tile will be at least closer to the respective allowable range, and the virtually dividing of the DUT, the determining of the BI stress parameter values, the identifying of any deviant tile, and the respective action responsive to the identification of any deviant tile can be repeated.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings.

It is noted that the drawings of the invention are not necessarily to scale. The drawings are intended to depict only typical aspects of the invention, and therefore should not be considered as limiting the scope of the invention. It is understood that elements similarly numbered between the FIGURES may be substantially similar as described with reference to one another. Further, in embodiments shown and described with reference to FIGS. 1-10, like numbering may represent like elements. Redundant explanation of these elements has been omitted for clarity. Finally, it is understood that the components of FIGS. 1-10 and their accompanying descriptions may be applied to any embodiment described herein.

DETAILED DESCRIPTION

Figure 1:
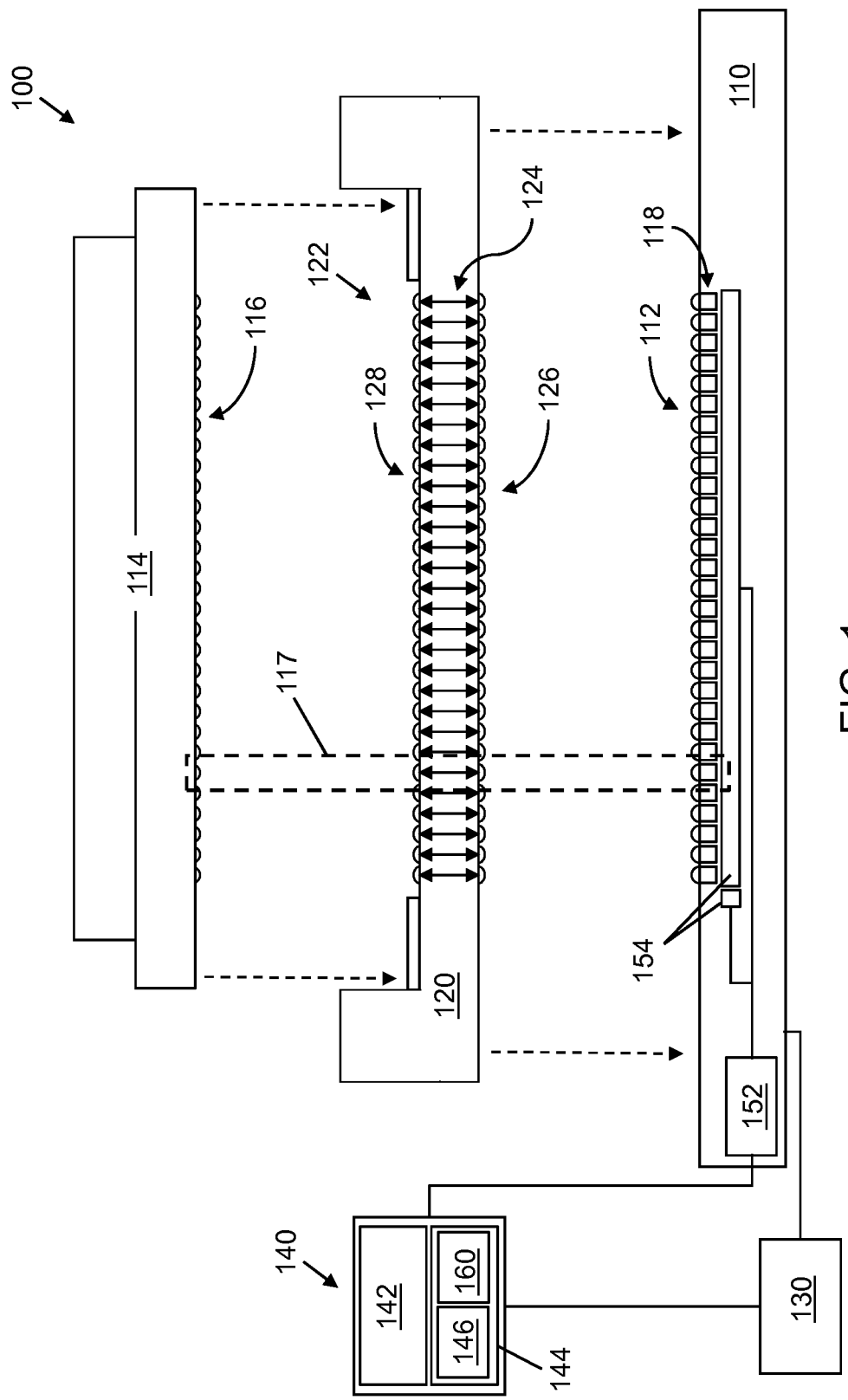
FIG. 1 is a schematic cross sectional illustration of a burn-in (BI) stress system according to an embodiment of the invention disclosed herein.

In a burn-in (BI) stress testing system 100 according to embodiments, as illustrated in FIG. 1, a BI board (BIB) 110 can include BIB contacts 112 through which power from a power source 130 can be delivered to a semiconductor device under test (DUT) 114 under direction of a controller 140. Controller 140 can include at least one computing device 142 and at least one non-transitory, computer-readable storage medium 144 on which can reside a computer program product 160 that when executed by computing device 142 can configure computing device 142 to generate a BI stress pattern in BI contacts 112 in which a particular voltage and/or current and/or power can be delivered thereto. While DUT 114 could conceivably be placed directly on BIB 110, DUT 114 can be carried in a socket tray 120 having a socket 122 configured to receive DUT 114. A plurality of socket connectors 124, or pins, corresponding to each package connector 116 of DUT 114 can be configured for engagement with package connectors 116 of DUT 114 via upper or DUT end contacts 126. Socket connectors 124 can extend through socket tray 120 from DUT end contacts 126 to corresponding BIB end contacts 128, which can also correspond to BIB contacts 112 so that each socket connector 124 can be in electrical communication with a respective BIB contact 112. Thus, each BIB contact 112 can be placed in electrical communication with a respective package connector 116 of DUT 114, and BIB 110 can deliver power to DUT 114 therethrough. A conductive pathway 117 can therefore extend from each BIB contact 112, through a corresponding socket connector 124, to a corresponding package connector 116, into DUT 114.

Figure 2:
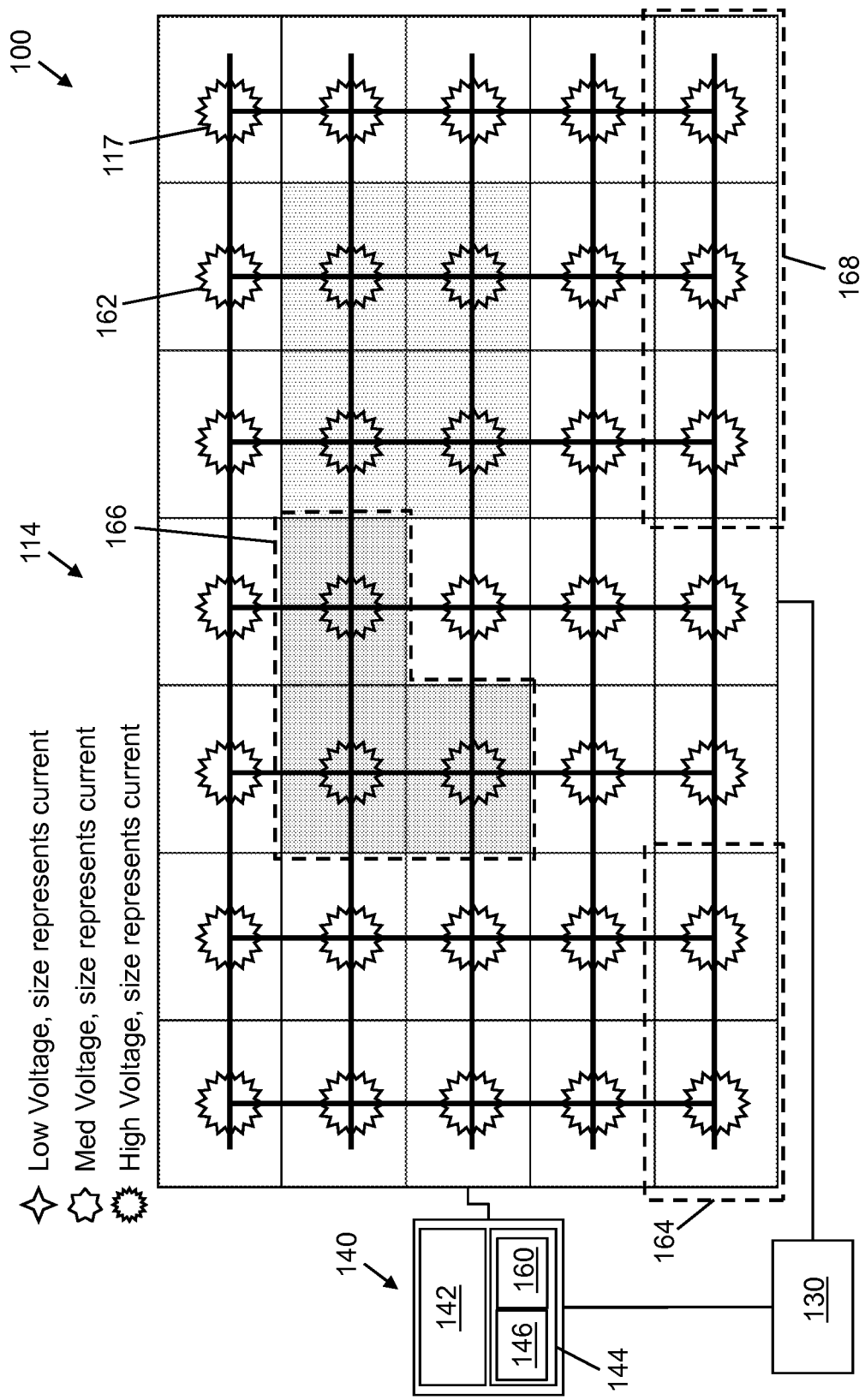
FIG. 2 is a schematic illustration of a response of a device under test (DUT) to a stress pattern applied with a system such as that of FIG. 1.

FIG. 2 shows a schematic plan view of the DUT 114 response to a typical pattern applied by BIB 110. For simplicity, the description refers to conductive pathways 117 between and/or including BIB contacts 112, socket connectors 124, BIB end contacts 126, DUT end contacts 128, package connectors 116, and/or DUT 114. Typically, BI stressing applies a uniform voltage and/or current across all activated conductive pathways 117, as illustrated in FIG. 2. By using a voltage and/or current that is significantly higher than a respective design value, a BI test temperature in DUT 114 can be raised far above a design nominal temperature of DUT 114. As a result of operating at BI test voltage and/or current and/or temperature, defects in DUT 114 that would not otherwise cause a failure or other problem for many days or weeks of operation can be accelerated to occur in hours or even shorter periods. However, testing at too high a BI voltage, current, and/or temperature can cause additional defects, such as by electromigration and/or other failure mechanisms, in a component of DUT 114.

Different components of DUT 114 can consume different amounts of power, and thus for a given BI test power, voltage, and/or current, some regions of DUT 114 will get hotter than others, which can lead to inconsistent stressing of DUT 114 and its components. For example, with continuing reference to FIG. 2, dividing DUT 114 into tiles 162 (virtually), one for each conductive pathway 117, some tiles 162 can consume more power than others to form high power regions 164. It should be noted that socket tray 120, and BIB contacts 112 can be viewed as having corresponding tiles and/or regions therein if convenient, suitable, and/or desired. In addition, some tiles 162 can have a higher operating temperature than others and can create hot regions 166 and/or cold regions 168. Further, some defects can introduce time variation of power consumption, which, as illustrated in FIG. 2, can result in a localized temperature increase in part of DUT 114 for a period, followed by a localized decrease in temperature even at a constant voltage. To improve testing, more targeted stressing has been achieved using particular BI stress patterns and/or power headers or the like to stress small areas of a DUT, but this can introduce even more temperature variation across the DUT, introducing further inconsistency into BI stress testing. Thus, current BI stress testing can suffer from location based variation and time-based variation.

To reduce such variation, embodiments of the invention disclosed herein include an improved semiconductor device burn-in (BI) stress system and method that can ensure that a profile of a particular electrical parameter or BI stress parameter of a DUT more closely corresponds with a desired profile of the parameter. Thus, if a uniform temperature profile is desired, embodiments can adjust a stress pattern applied to a DUT to change temperature at various locations of the DUT to make the profile more uniform. Likewise, if a particular region is desired to experience a lower or higher temperature than other regions of the DUT, embodiments can alter the applied stress pattern to achieve such temperature changes. Similar actions can be done with a power consumption profile, a voltage profile, a current profile, and/or a profile of any other suitable electrical parameter of the DUT.

More specifically, with further reference to FIG. 1, embodiments of the invention can include a respective control device 118 for each BIB contact 112 which, responsive to controller 140, can selectively provide power to each BIB contact 112 at a desired voltage, current, power, and/or other electrical parameter. In embodiments, control device(s) 118 can take the form of any suitable device that can be used to adjust an electrical or operating parameter or power delivered to respective BIB contact 112. Using control devices 118, a respective voltage and/or current and/or power can be delivered to each BIB contact 112. Controller 140 can thus instruct BIB 110 to provide power to BIB contacts 112 in an applied BI stress pattern with contact- and/or pin-specific values of voltage and/or current and/or power, which, through conductive pathways 117 can be applied to package connectors 126 and DUT 114.

Figure 3:
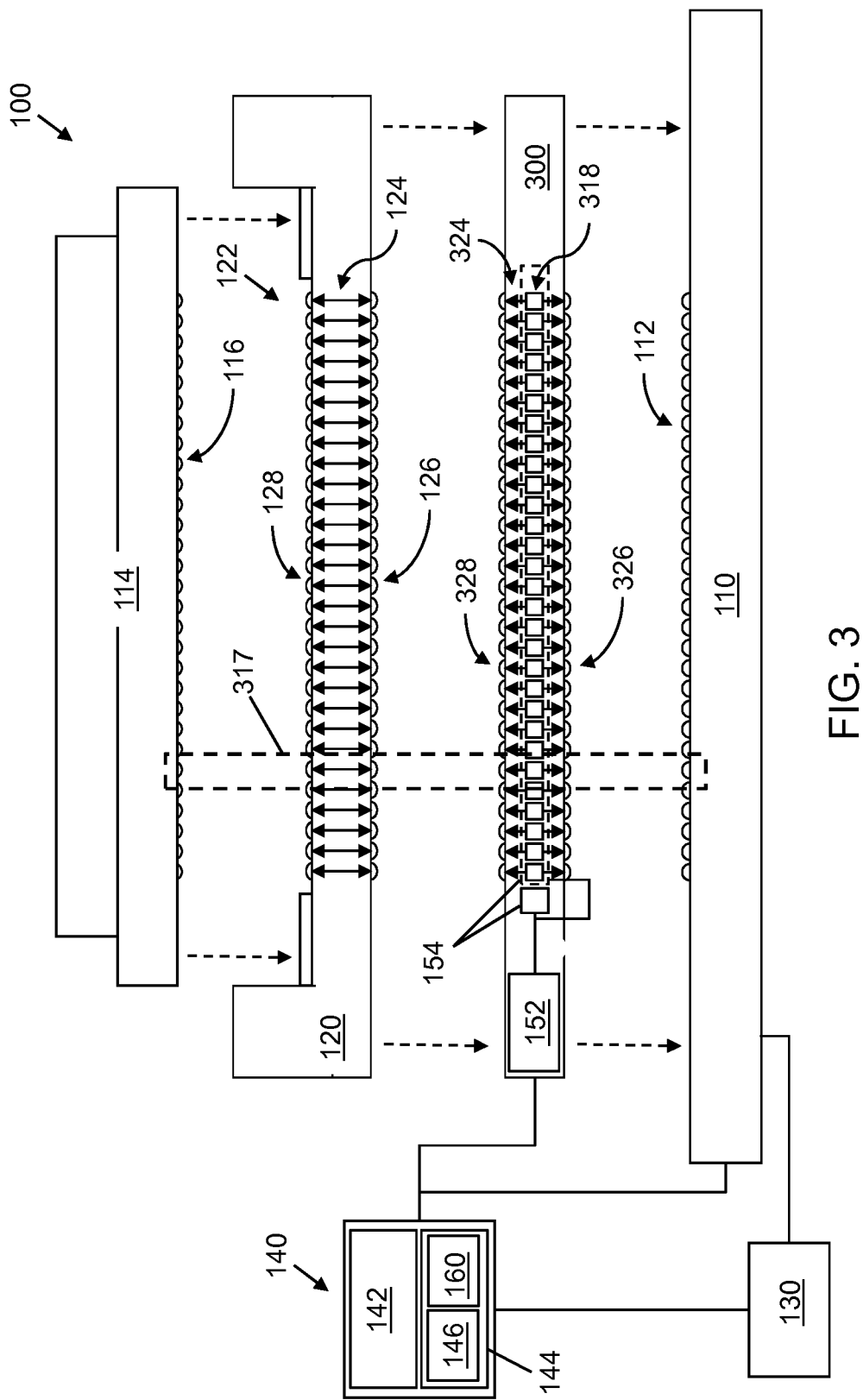
FIG. 3 is a schematic cross sectional illustration of a BI stress system according to an embodiment of the invention disclosed herein.

In embodiments, such as in the example shown in FIG. 3, an interposer (IP) 300 can be inserted between BIB contacts 112 and package connectors 126, such as between socket tray 120 and BIB 110, to provide a contact- and/or pin-specific applied BI stress pattern with a respective IP control device 318, as will be explained below. Use of IP 300 can allow application of embodiments to existing equipment with minor, if any, changes in the equipment and/or processes. IP 300 can take the form of a through silicon via (TSV) based IP, and in embodiments can be incorporated into socket tray 120, but regardless of the particular implementation, IP 300 can be in communication with controller 140 and can include IP paths 324 corresponding to BIB contacts 112 and to socket connectors 124, as well as DUT package connectors 116. Each IP path 324 can include an IP input contact 326 arranged for electrical communication with a respective BIB contact 112 and an IP output contact 310 arranged for electrical communication with a respective package connector 124 of DUT 114, such as via a respective socket connector 124. Each IP path 324 can further include an IP control device 318 in electrical communication with IP input contact 326 and IP output contact 328, and can be in communication with and responsive to controller 140. Thus, each IP path 324 can be part of a conductive pathway 317 from each BIB contact 112 to a respective package connector 116, such as through a respective socket connector 124. Each IP control device 318 can be arranged to adjust an electrical parameter or BI stress parameter of power received at a respective IP input contact 326 to an adjusted parameter of power delivered to a respective IP output contact 328 responsive to controller 140. As with BIB internal control device 118, IP control device 318 can be any suitable control device.

Figure 4:
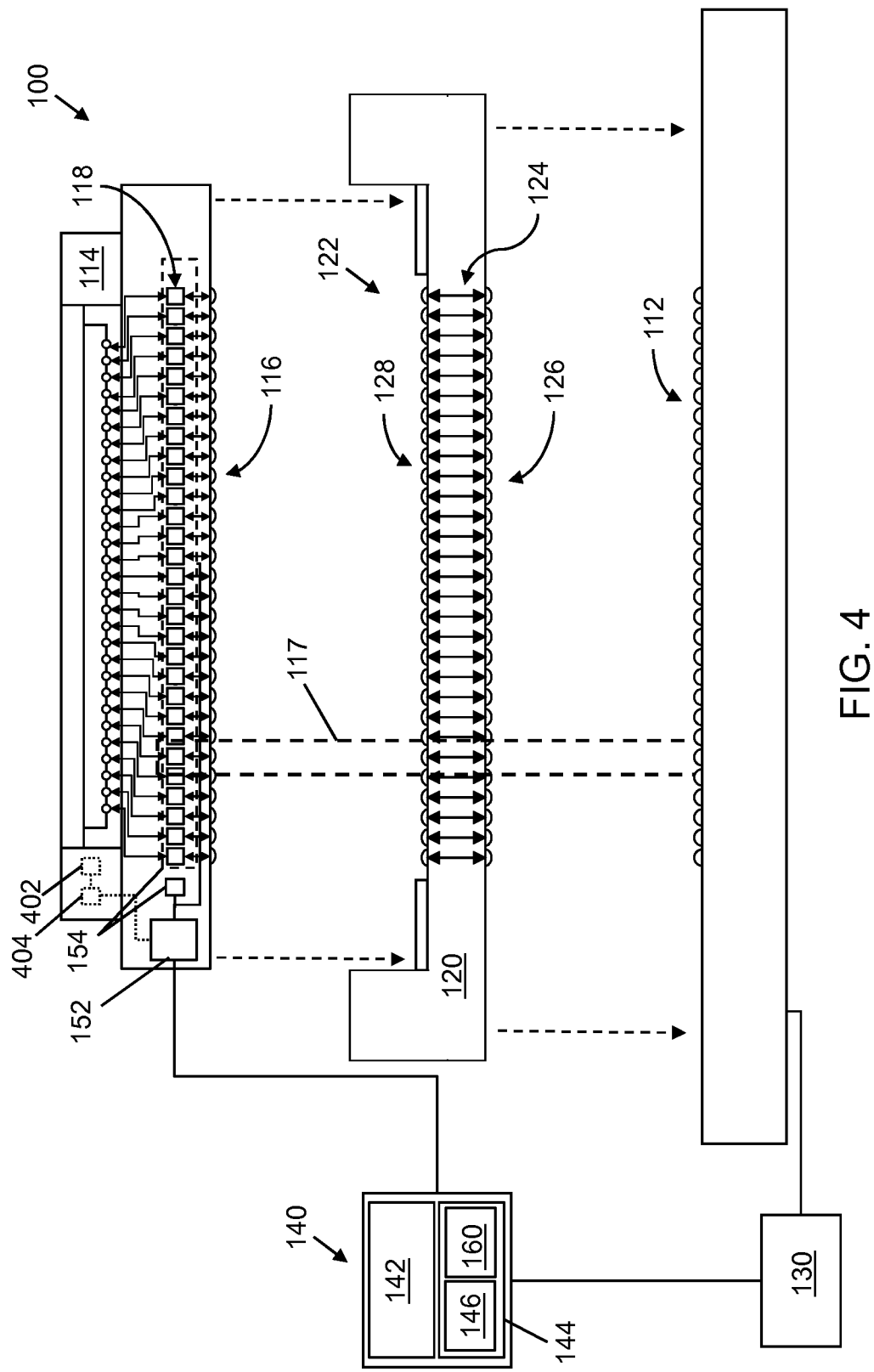
FIG. 4 is a schematic cross sectional illustration of a BI stress system according to an embodiment of the invention disclosed herein.

In another embodiment, control devices 118 can be included in and/or added onto DUT 114, as seen in FIG. 4. Each control device 118 can be connected to a respective input contact 116, as well as to a respective device or contact within DUT 114. Thus, respective conductive pathways 117 can include contacts 112 of BIB 110, input contacts 126 of socket tray 120, output contacts 128 of socket tray 122, and input contacts 116, as well as internal connections and/or contacts to and/or of DUT 114. Thus, each respective control device 118 can be in electrical communication with a respective input contact 116 and a respective DUT contact so that each control device 118 can alter power received at input contact 116 and delivered to DUT contact(s), such as by altering a BI stress parameter imposed by BIB 110 responsive to controller 140 and/or another computing device, and/or additional components of a control structure, such as an addressing arrangement 150 with a control circuit 152 and addressing devices 154, as will be described below. It should be noted that embodiments can include an on-board non-transitory storage medium 402 configured for communication with a computing device 404, which computing device 404 can be on-board and/or external to DUT 114.

Control devices 118 and/or IP control device 318 in embodiments can be controlled by controller 140 and/or computing device 142 using an addressing arrangement 150, an example of which shown in FIGS. 1-4. With specific reference to FIG. 5, a schematic illustration of a top surface of BIB 110 and/or IP 300 shows a square corresponding to a respective region around a respective contact and/or conductive pathway and a respective control device 118/318. Thus, control devices 118/318 can be laid out in a two-dimensional array and addressing arrangement 150, using a control circuit 152 in communication with controller 140 and/or computing device 142, activate and/or deactivate and/or adjust control devices 118/318 with addressing devices 154 connected to control devices 118/318.

Figure 5:
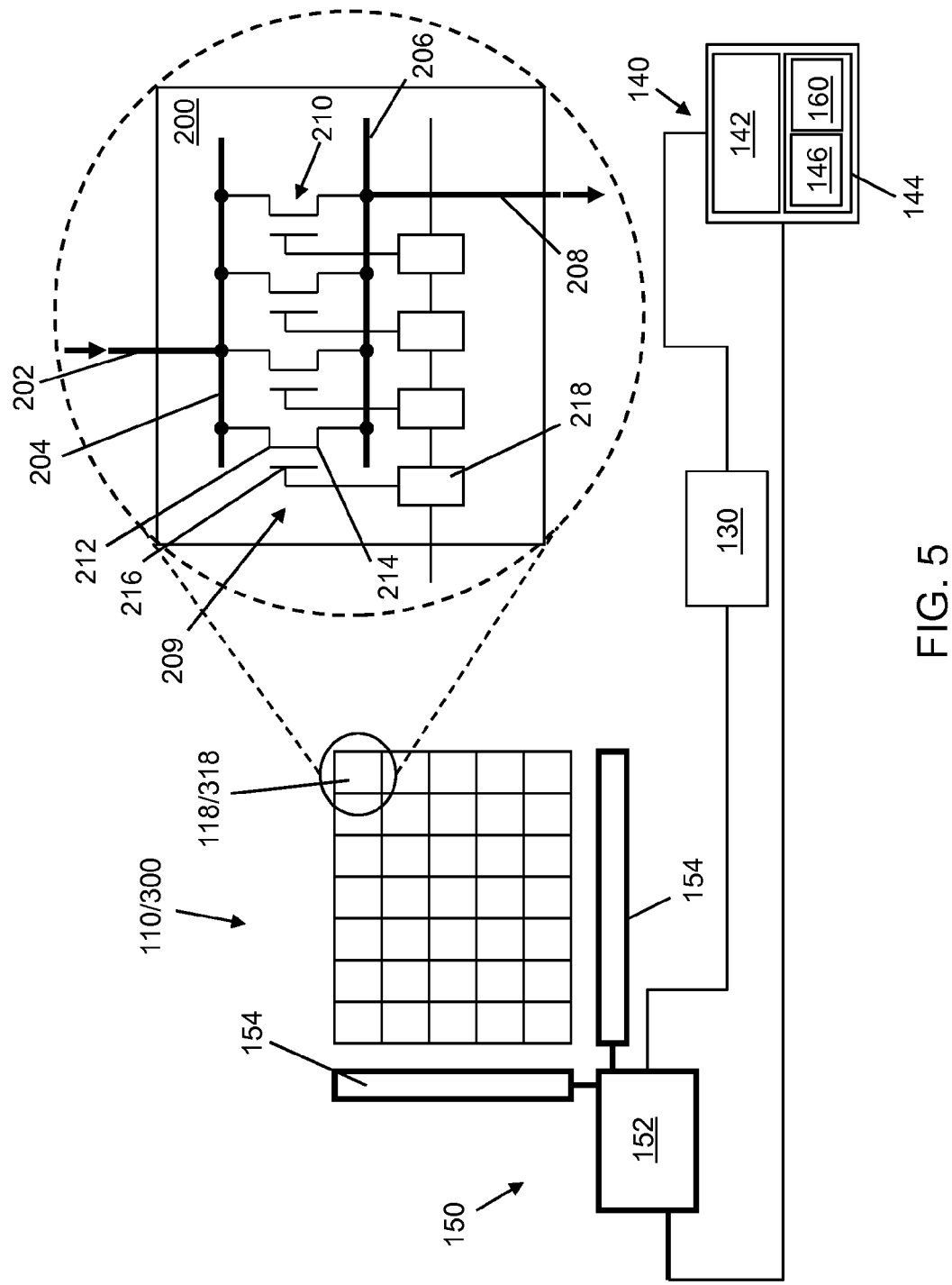
FIG. 5 is a schematic illustration of a control device arrangement, an associated addressing arrangement, and an example control device usable with a BI stress system according to an embodiment of the invention disclosed herein.

A suitable control device 118/318 can take the form of, for example, a voltage regulator, such as regulator 200 shown in FIG. 5, or a power gate. Voltage regulator 200 can include an input line 202 in electrical communication with an input power header 204 that can in turn be in electrical communication with a latchable array 209 of field effect transistors (FETs) 210. Latchable array 209 can also be in electrical communication with an output power header 206, which in turn can be connected to an output line 208. Where BI stress system 100 employs BIB internal control devices 118, input line 202 can be in electrical communication with and receive power from power source 130, and output line can be in electrical communication with a respective BIB contact 112. In embodiments in which BI stress system 100 includes IP 300 and IP control devices 318, input line 202 can be in electrical communication with a respective IP input contact 326, and output line 208 can be in electrical communication with a respective IP output contact 328.

Latchable array 209 can include one or more FET 210 electrically connected between input and output power headers 204, 206. For example, each FET can include a drain line 212 connected to input power header 204 and a source line 214 connected 206. Thus, input power header 204 can distribute power from input line 202 to each FET 210, and output header 206 can gather power from any active FET 210 that can then travel to output line 208. Each FET 210 can further include a gate 216 responsive to a respective latch 218 that can control gate 216 responsive to addressing arrangement 150. Thus, by activating or deactivating FETs 210 via latches 218, a voltage across latchable array 209 can be adjusted and/or controlled. While four control latches 218 and FETs 210 are shown in FIG. 5, it should be clear that more or fewer FETs 210 and control latches 218 could be used if desired and/or appropriate. Each latch 218 can be responsive to one or both addressing devices 154 responsive to control circuit 152 of addressing arrangement 150.

Figure 6:
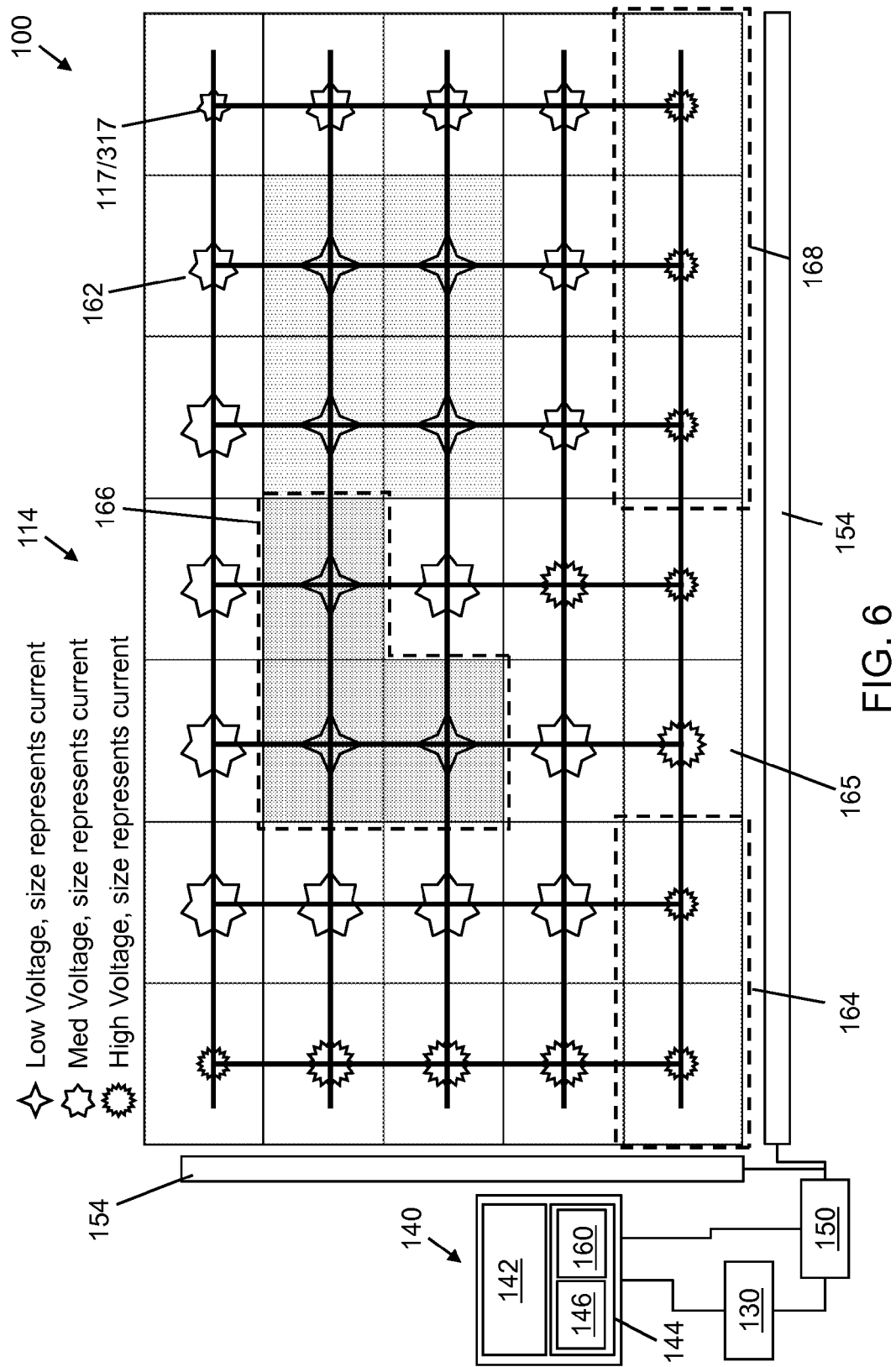
FIG. 6 is a schematic illustration of an adjusted stress pattern applied with embodiments of the invention disclosed herein to adjust a profile of a parameter of the DUT to more closely correspond with a desired profile.

Turning now to FIG. 6, and with continued reference to FIGS. 1-5, an embodiment of BI stress system 100 can address a non-uniform stress response of a DUT 114, such as that shown in FIG. 2, by adjusting an applied BI stress pattern to make the response more uniform, as illustrated in FIG. 6. FIG. 6 shows a schematic plan view of the DUT 114 response shown in FIG. 2, but just after adjustment of the applied BI stress pattern by an implementation of BI system 100 according to embodiments. For simplicity, the description with respect to FIG. 6 refers to conductive pathways 117, 317 between and/or including BIB contacts 112, IP paths 324, IP input contacts 326, IP output contacts 328, socket connectors 124, BIB end contacts 126, DUT end contacts 128, package connectors 116, and/or DUT 114. In addition, the description with respect to FIG. 6 will refer to an embodiment including an interposer (IP) 300 and its associated control devices 318, but it should be understood that the bulk of the description can also applied to embodiments in which BIB internal control devices 118 are employed.

Thus, an embodiment of BI stress system 100 can determine a BI profile of an electrical parameter or BI stress parameter of DUT 114, and configure IP 300, such as by configuring at least one IP control device 318, to adjust power delivered to DUT 114 such that the BI profile more closely corresponds to a desired profile of the electrical or BI stress parameter. In embodiments, the desired profile can be stored on storage medium 144, such as part of a BI plan that can take the form of a data file 146 and can include additional information usable by computer program product 160. For example, data file 146 can include, but is not limited to including, one or more desired profiles of electrical or BI stress parameters, properties and layouts of DUT 114, threshold values of electrical and/or operating or BI stress parameters, and/or additional information as may be suitable and/or desired. Controller 140 can, for example, acquire at least one of BI pattern of a BI plan to be applied to BIB 110, the BI pattern including a control setting for BIB 110. The BI pattern can be applied with BIB 110 and/or a control structure, such as control devices 118 or IP 300. Where each IP control device 318 includes a voltage regulator similar to regulator 200 of FIG. 5, for example, computing device 142 of controller 140 can determine a BI temperature profile of DUT 114 from the BI pattern or plan, then send commands to control circuit 152 so as to selectively activate latches 218 of one or more regulators 200 with addressing devices 154 to adjust voltage delivered to DUT 114, thus adjusting the BI temperature profile of DUT 114 to more closely resemble or correspond to a desired temperature profile.

Figure 7:
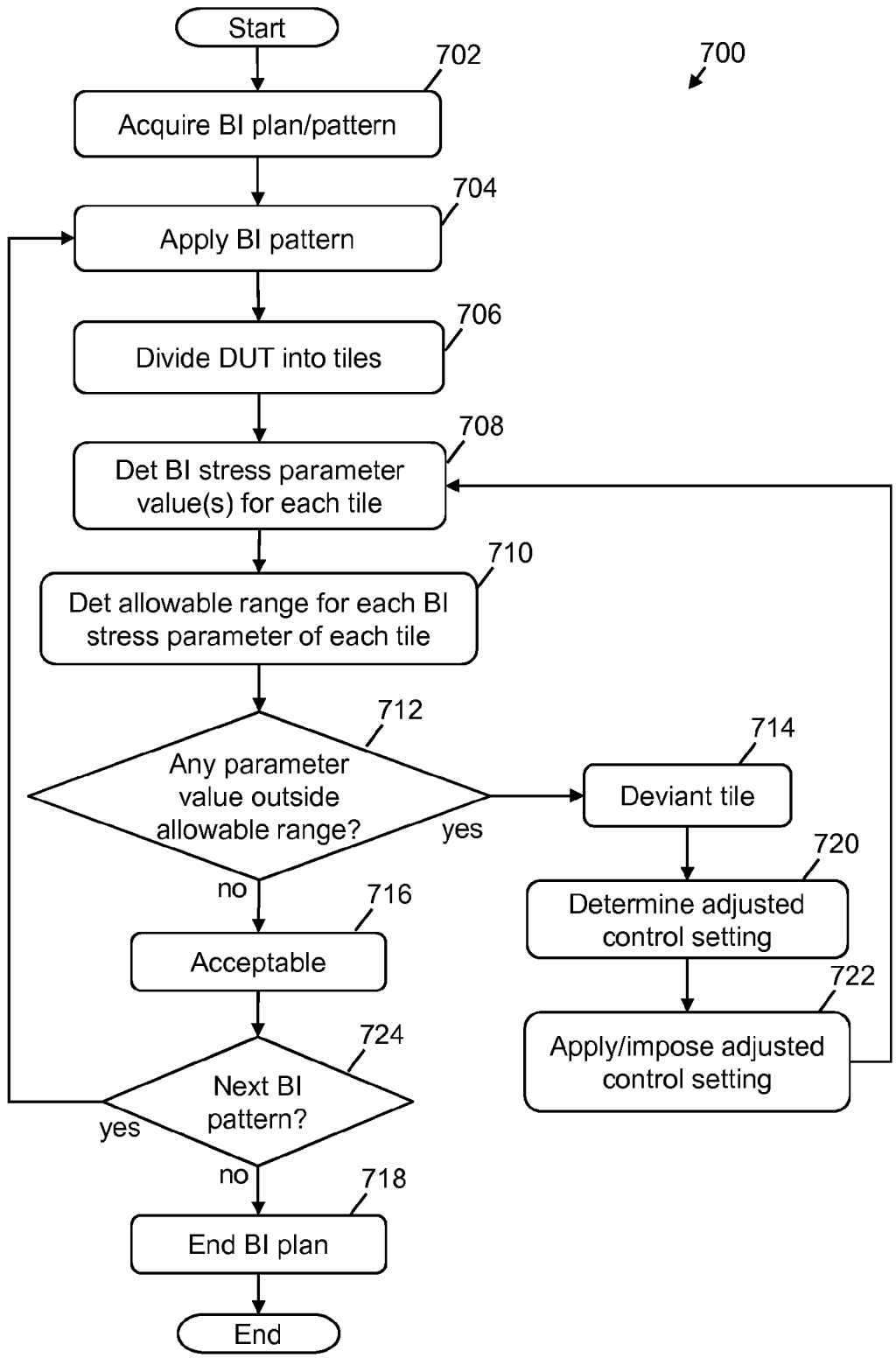
FIG. 7 is a schematic flow diagram illustrating a BI stress method according to embodiments of the invention disclosed herein.

More specifically, with additional reference to FIG. 7 where blocks of a method 700 are mentioned, embodiments of BI stress system 100 can include a computer program product 160 that includes instructions that configure computing device 142 to acquire at least one BI plan and/or BI pattern (block 702) and apply each BI pattern (block 704), such as by imposing a respective control setting on the control structure. DUT 114 can respond to the BI pattern, and its response can be determined, for example, by virtually dividing DUT 114 into a plurality of tiles 162 (block 706), such as at least two tiles, each tile 162 having associated therewith a respective contact and/or package connector 116 of DUT 114 and/or a conductive pathway 317 thereto. Each tile 162 can be tested by determining a respective value of at least one BI stress parameter of the tile being tested (block 708). For example, computing device 142 can be configured to determine a respective amount of power being drawn during BI stress, which can be used to form a BI power profile of DUT 114 (block 404).

A respective allowable BI stress parameter range can be determined for each of the at least one BI stress parameter (block 710) for each conductive pathway 117 and/or tile 162. Each allowable range can include at least one boundary value for the respective BI stress parameter, each boundary value including one of a minimum value or a maximum value for the respective BI stress parameter. The respective measured or determined BI stress parameter values can be compared to the respective allowable range (block 712), and any tile with a respective BI stress parameter value outside of the respective allowable range can be identified as a deviant tile (block 714). Where every BI stress parameter value of a tile is within the respective allowable range, the tile can be flagged as acceptable (block 716). If no deviant tile is identified for any BI pattern of a BI plan, and/or if every tile is flagged as acceptable, the BI plan can be ended (block 718). However, if at least one tile is identified as deviant, an adjusted control setting can be determined (block 720) to adjust the control structure such that every BI stress parameter value of any deviant tile can be at least closer to the respective allowable range, and the respective BI pattern and testing can be repeated applying and/or imposing and/or using the adjusted control setting (block 722, blocks 708 et seq.). Computing device 142 can be configured to determine whether there is another or next BI pattern to be applied (block 724), can apply the next BI stress pattern (block 704) if there is one, and can repeat testing (blocks 706 et seq.). When there is no next BI pattern, the BI plan can be ended (block 718).

For example, a BI stress parameter can be power delivered and/or consumed, and a power delivered value and a maximum deliverable power for each package connector 116 can be determined and compared. For any tile 162 drawing more than the respective maximum deliverable power, a control setting can be determined that will reduce power consumption of the respective tile 162. In embodiments, the control setting determination can take BI stress parameter values of other tiles 162 into account during determination of an adjusted control setting. That is, an effect of at least one other tile 162 on the at least one respective BI stress parameter of the tile being tested can be determined, such as by determining a voltage drop between the tile being tested and one or more other tiles. It should be noted that determination of any BI stress parameter value and/or maximum allowable BI stress parameter value can include collecting and/or retrieving and/or receiving data from DUT 114 and/or socket tray 120 and/or BIB 110. Further, data collected during testing of similar devices of a same or similar design can be retrieved and/or received and used in determination of any BI stress parameter value and/or any maximum allowable BI stress parameter value. Other BI stress parameters can include temperature, current, and/or voltage, as well as any other suitable property and/or parameter as may be desired.

In embodiments, at least one BI pattern can apply different BI stress parameter profiles to different portions of DUT 114. For example, higher stress can be induced on a first portion of DUT 114 than in a second portion. Alternatively and/or in addition, a BI stress parameter profile of a first portion can be changed in a first manner and a BI stress parameter profile of a second portion can be changed in a second manner, such as to change the BI stress parameter profile over the sum of the first and second portions substantially uniform. A manner of change can include an increase, a decrease, and/or not changing a BI stress parameter value and/or profile of a portion of DUT 114.

In an embodiment, computing device 142 can be configured to virtually divide DUT 114 into tiles (block 802) and determine at least one BI stress parameter value for each tile (block 804), such as power, temperature, current, and/or voltage. A maximum deliverable power can be determined for each tile/conductive pathway (block 806), and any tile 162 drawing more than a threshold or maximum allowable power value can be identified (block 808) as a high power tile. Each high power tile can be part of at least one high power region 164, adjacent high power tiles being part of a same high power region 164 (block 810). It should be recognized that the term "high power" as used herein means more power than a threshold value. For each high power region 164, a total area can be determined, and, in response to the total area of a high power region 164 exceeding a threshold area value (block 812), IP 300 can be configured to reduce power consumption in high power region 164 (block 814). In embodiments, for example, IP control devices 318 of all high power tiles in a high power region 164 can be configured to reduce power consumption in the high power region 164 (block 816), though in other embodiments, fewer IP control devices 318 can be so configured (block 816). A check can be made for a failure (block 818), which can result in stopping/end in response to a failure having occurred or repeating from determining for each tile 162 power, temperature, current and/or voltage values (block 804) in response to no failure having occurred.

In response to the total area of a particular high power region 164 being no more than the threshold area value (block 812), IP 300 can be configured to draw power from at least one donor tile 165 (block 820) outside the high power region 164 to one or more high power tiles in the high power region 164. Computing device 142 can therefore be configured to identify a donor tile 165 by determining a respective current delivered to each tile 162 through the respective conductive pathway, IP path 302, and/or package connector 116 (block 804). Any tile 162 outside a high power region 164 to which more current is delivered than is delivered to any high power tile in the high power region 164 (block 822) can be identified as a donor tile 165 (block 824). A donor tile 165 can be adjacent the high power region 164, though that need not be the case. To draw power from each donor tile 165 to the high power region 164, computing device 142 can be configured to determine a respective voltage drop that would occur between each donor tile 165 and the respective high power region and/or high power tile(s) (block 826) were power drawn from the respective donor tile 165 to the respective high power region. Responsive to a voltage drop associated with a donor tile 165 being less than a donor threshold voltage (block 828), power can be drawn to the respective high power region 164 from the respective donor tile 165 (block 820). Each power draw can be achieved by setting a respective voltage for each tile, donor tiles and high power tiles, based at least in part on the determined voltage drop of each donor tile 165, and configuring control devices 118/318 according to such values (block 816)

In embodiments, with additional reference to FIG. 7 where blocks of a method 500 of embodiments are mentioned, after dividing DUT 114 into tiles (block 902), computer program product 162 can instead, or in addition, include instructions that configure computing device 142 to adjust a BI temperature or other profile of DUT 114 to more closely correspond to a predefined or desired temperature or other profile. For example, computing device 142 can be configured to determine a temperature profile for DUT 114, such as by determining a respective tile temperature of each tile 162 (block 904). Any tile with a respective tile temperature above a first threshold temperature (block 906) can be identified as a hot tile that can be part of a hot region 166, adjacent hot tiles being part of a same hot region 166 (block 908). Likewise, any tile with a respective tile temperature below a second threshold temperature (block 910) can be identified as a cold tile that can be part of a cold region 168, adjacent cold tiles being part of a same cold region 168 (block 912). It should be recognized that the term "hot" as used herein means higher temperature than a first threshold value, and the term "cold" as used herein means lower than a second threshold value. Parameter values of DUT 114 that can adjust temperature of one or more hot and/or cold tiles to achieve a desired profile can be determined (block 914). The at least one IP control device 318 of IP 300 can then be configured in accordance with the determined parameter values (block 916), an can thus be used to adjust at least one operating parameter of each respective IP path 302 to change the BI temperature profile to more closely correspond to a desired temperature profile. A check can be made for a failure (block 918), which can end execution of computer program product 160 if failure is detected or return to determining power, temperature, current, and/or voltage of each tile (block 904). FIG. 5, as mentioned above, shows conductive pathways 117/317 with an applied stress pattern adjusted according to embodiments. As compared to FIG. 2, for example, the example of FIG. 5 shows reduced voltage applied in hot region 166, reduced current in high power region 164, reduced current in cold region 168, and other changes to effect a change away from the response of DUT to uniform higher voltage and current, toward a desired profile, such as uniform temperature.

To enhance operation, computer program product 160 can further include instructions that configure the computing device 142 to determine an effective stress acceleration (block 920) of the semiconductor device using the BI temperature profile, and to determine effective parameter values in accordance with the effective stress acceleration (block 922). At least one IP control device 318 of IP 300 can be configured in accordance with the effective parameter value(s) (block 924) to adjust an applied stress pattern applied to DUT 114 using the effective stress acceleration. A respective updated tile temperature of each tile can then be determined (block 926), and hot and cold tiles can be identified (blocks 506-512) using the updated tile temperatures, such as by setting the tile temperature(s) to the updated tile temperature value(s) (block 928).

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, computing device, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, computing device, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks. The computer readable medium can be part of and/or built into and/or onto DUT 114 in embodiments, as can a computing device in communication with the computer readable medium so that an on-board computing device can execute instructions stored in on-board computer readable medium of DUT 114, though in embodiments, on-board computer readable medium can be configured for communication with an external computing device, such as controller 140, which can retrieve and/or load and execute such instructions.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 8:
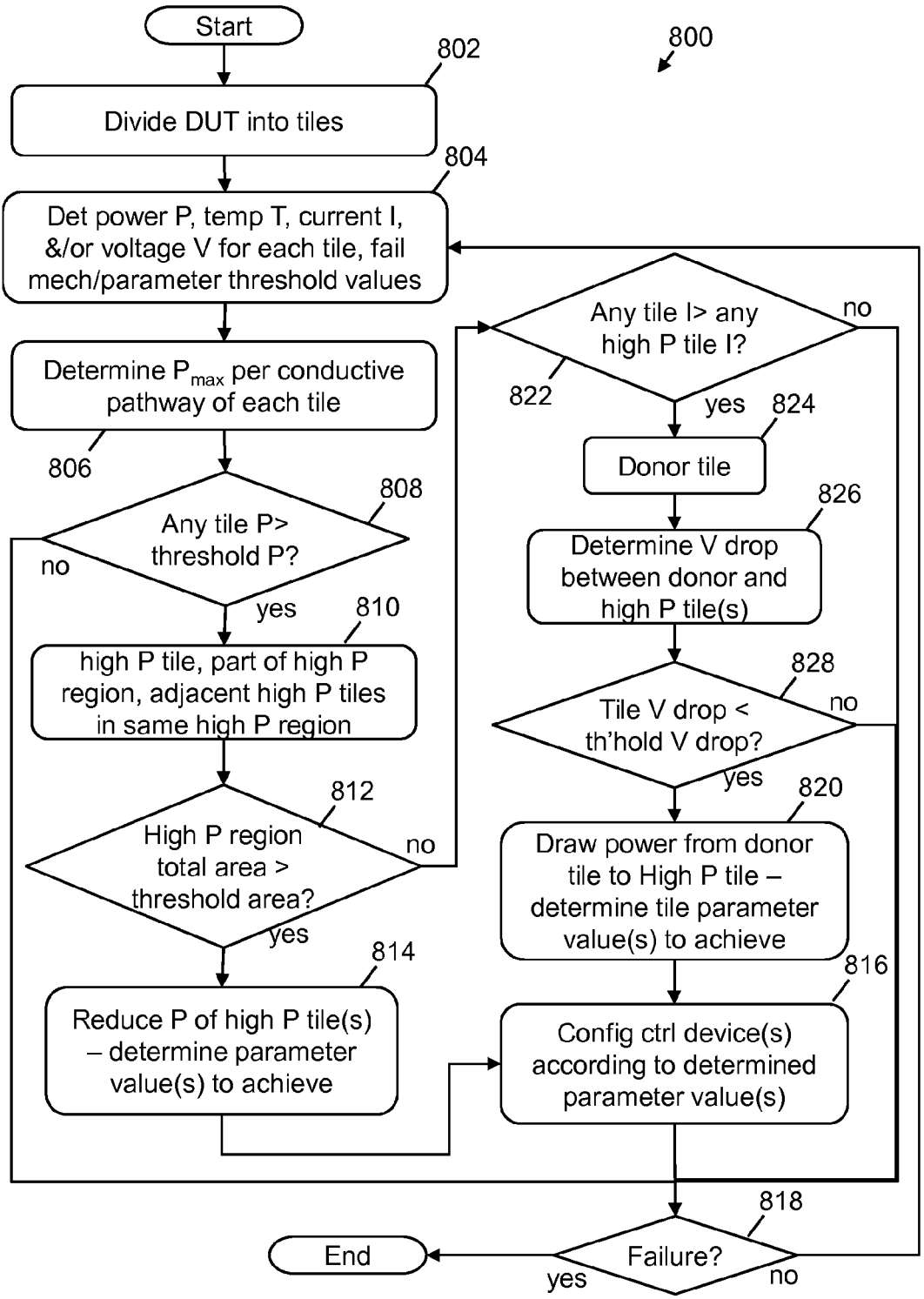
FIG. 8 is a schematic flow diagram illustrating a BI stress method according to embodiments of the invention disclosed herein.

A BI stress system according to embodiments of the invention disclosed herein may be implemented as a circuit design structure. FIG. 8 illustrates a block diagram of a general-purpose computer system which can be used to implement the circuit and circuit design structure described herein. The design structure may be coded as a set of instructions on removable or hard media for use by general-purpose computer. FIG. 8 is a schematic block diagram of a general-purpose computer for practicing the present invention. FIG. 8 shows a computer system 800, which has at least one microprocessor or central processing unit (CPU) 805. CPU 805 is interconnected via a system bus 820 to machine readable media 875, which includes, for example, a random access memory (RAM) 810, a read-only memory (ROM) 815, a removable and/or program storage device 855 and a mass data and/or program storage device 850. An input/output (I/O) adapter 830 connects mass storage device 850 and removable storage device 855 to system bus 820. A user interface 835 connects a keyboard 865 and a mouse 860 to system bus 820, and a port adapter 825 connects a data port 845 to system bus 820 and a display adapter 840 connect a display device 870. ROM 815 contains the basic operating system for computer system 800. Examples of removable data and/or program storage device 855 include magnetic media such as floppy drives, tape drives, portable flash drives, zip drives, and optical media such as CD ROM or DVD drives. Examples of mass data and/or program storage device 850 include hard disk drives and non-volatile memory such as flash memory. In addition to keyboard 865 and mouse 860, other user input devices such as trackballs, writing tablets, pressure pads, microphones, light pens and position-sensing screen displays may be connected to user interface 835. Examples of display device 870 include cathode-ray tubes (CRT) and liquid crystal displays (LCD).

A machine readable computer program may be created by one of skill in the art and stored in computer system 800 or a data and/or any one or more of machine readable medium 875 to simplify the practicing of this invention. In operation, information for the computer program created to run the present invention is loaded on the appropriate removable data and/or program storage device 855, fed through data port 845 or entered using keyboard 865. A user controls the program by manipulating functions performed by the computer program and providing other data inputs via any of the above mentioned data input means. Display device 870 provides a means for the user to accurately control the computer program and perform the desired tasks described herein.

Figure 9:
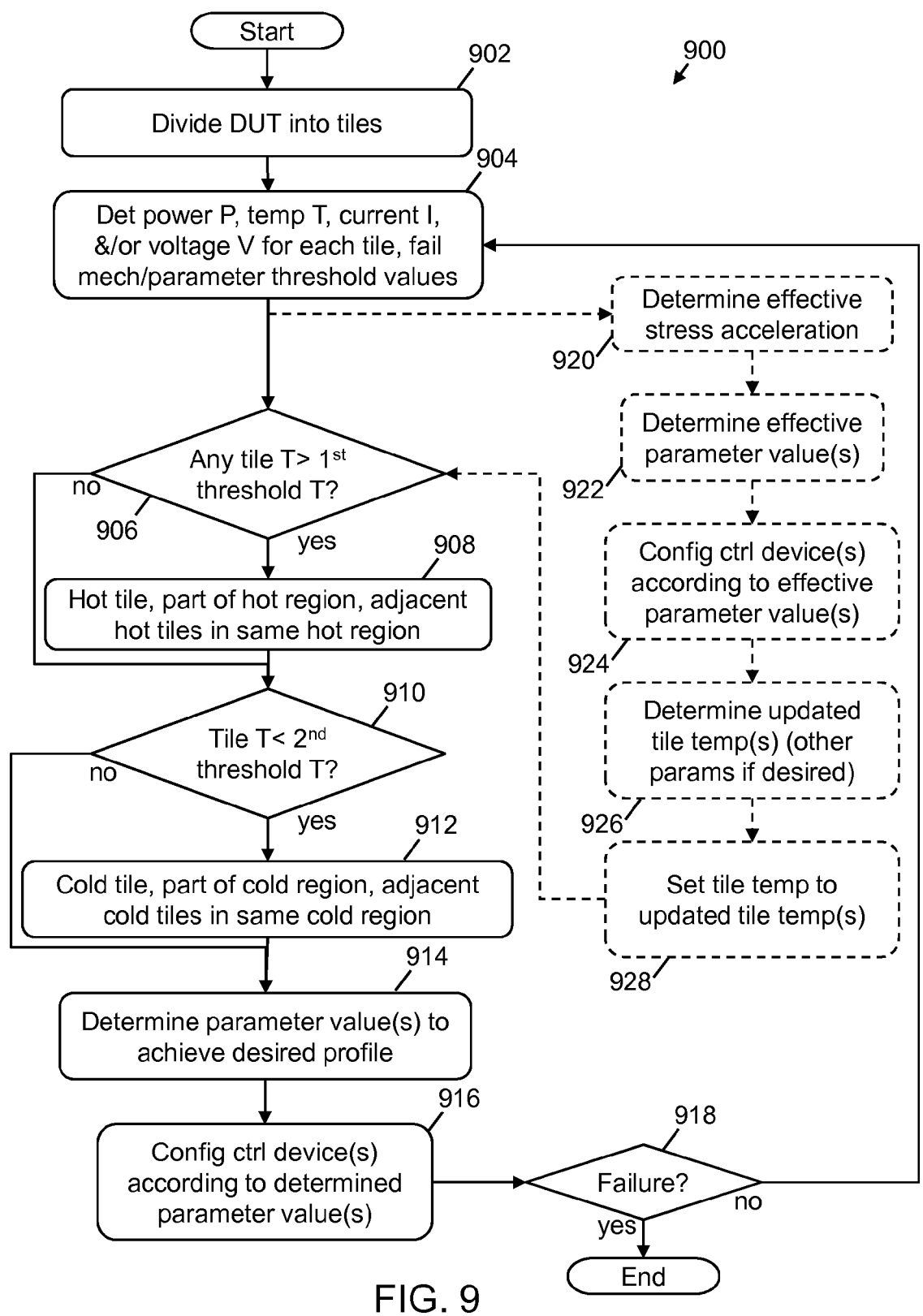
FIG. 9 is a schematic flow diagram illustrating a BI stress method according to embodiments of the invention disclosed herein.
Figure 10:
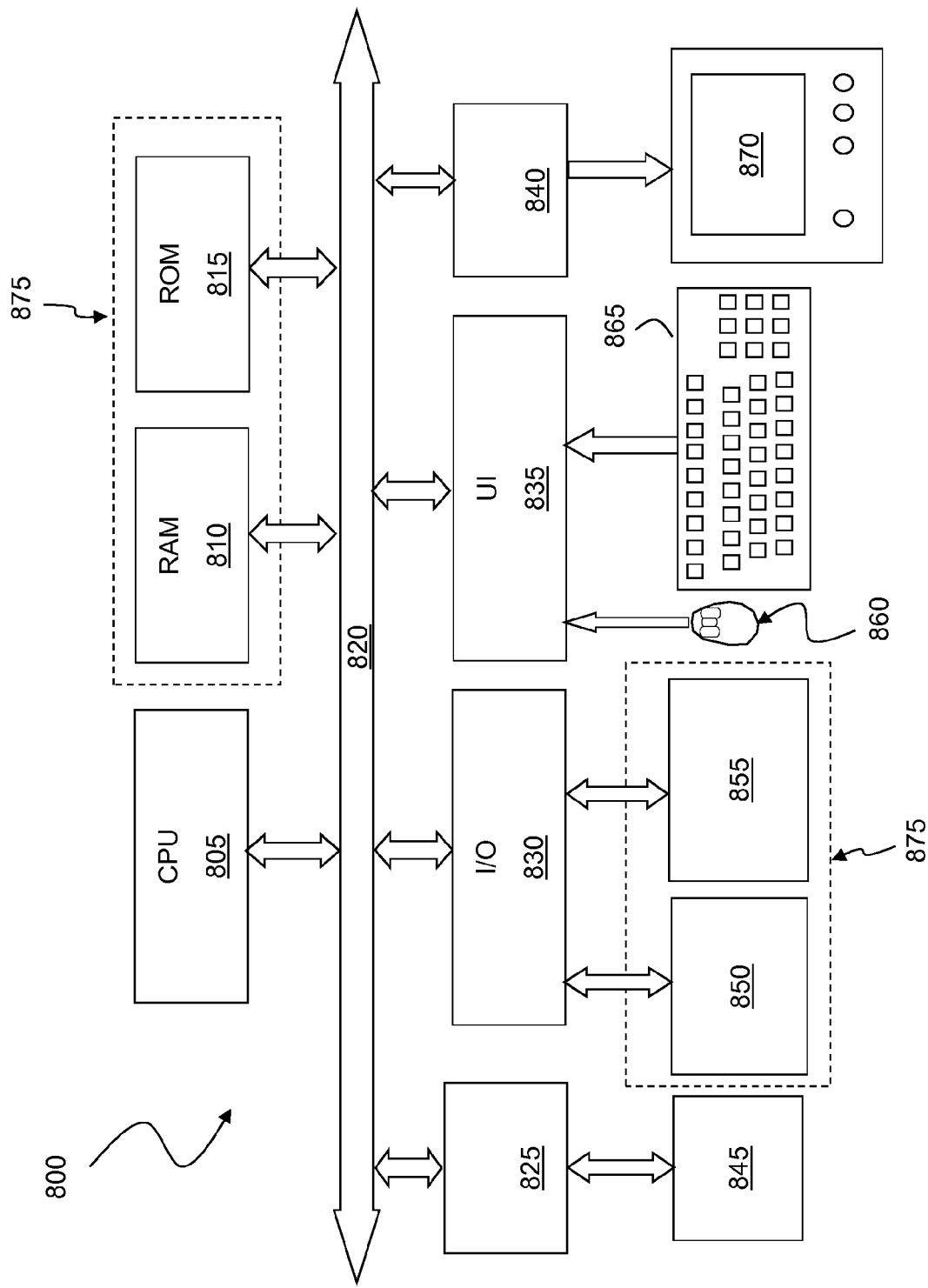
FIG. 10 is a schematic diagram of a computing environment with which embodiments of the invention disclosed herein can be implemented and in which embodiments of the invention disclosed herein can be executed.

FIG. 9 shows a block diagram of an example design flow 900. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 can comprise BI stress system 200 in the form of schematics or HDL, a hardware-description language (e.g., Verilog, VHDL, C, etc.). Design structure 920 may be contained on one or more machine readable medium. For example, design structure 920 may be a text file or a graphical representation of BI stress system 200. Design process 910 preferably synthesizes (or translates) BI stress system 200 into a netlist 980, where netlist 980 is, for example, a list of wires, transistors, logic gates, control circuits, I/O, models, etc., that describes the connections to other elements and circuits in an integrated circuit design and recorded on at least one of machine readable medium. This may be an iterative process in which netlist 980 is re-synthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Ultimately, design process 910 preferably translates BI stress system 200, 300, along with the rest of the integrated circuit design (if applicable), into a final design structure 990 (e.g., information stored in a GDS storage medium). Final design structure 990 may comprise information such as, for example, test data files, design content files, manufacturing data, layout parameters, wires, levels of metal, vias, shapes, test data, data for routing through the manufacturing line, and any other data required by a semiconductor manufacturer to produce BI stress system 200, 300. Final design structure 980 may then proceed to a stage 985 where, for example, final design structure 980 proceeds to tape-out, is released to manufacturing, is sent to another design house or is sent back to the customer.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device burn-in (BI) stress computer program product stored on a non-transitory computer readable storage medium including instructions in the form of executable computer code that when executed by a computing device configure the computing device to perform a method comprising:
   virtually dividing a device under test (DUT) into a plurality of tiles;
   providing a BI board (BIB) including a plurality of BIB contacts each configured to deliver power to a respective tile;
   providing a control structure including a plurality of control devices each configured to alter power delivered to a respective tile;
   delivering power to the BIB contacts according to a BI pattern, each BIB contact being in electrical communication with a respective tile via a respective control device;
   determining a BI stress parameter value and a maximum allowable value thereof for each tile;
   comparing the respective BI stress parameter value and maximum allowable value of each tile; and
   responsive to a BI stress parameter value exceeding the respective maximum allowable value, adjusting the control structure to reduce the BI stress parameter value and repeating the determining and the comparing of the BI stress parameter values, wherein the adjusting of the control structure includes determining an effect of at least one other tile on the BI stress parameter of each tile.

2. The semiconductor device burn-in (BI) stress computer program product of claim 1, wherein each BI stress parameter includes one of current, voltage, power, or power density.

3. The semiconductor device burn-in (BI) stress computer program product of claim 1, wherein the plurality of control devices includes power gates.

4. The semiconductor device burn-in (BI) stress computer program product of claim 3, wherein the control structure is part of the DUT.

5. The semiconductor device burn-in (BI) stress computer program product of claim 3, wherein the control structure includes a separate structure between the semiconductor device and the BIB.

6. The semiconductor device burn-in (BI) stress computer program product of claim 1, wherein the determining of the BI stress parameter value includes collecting data from the DUT.

7. The semiconductor device burn-in (BI) stress computer program product of claim 1, wherein the determining of the BI stress parameter value includes retrieving data collected during testing of a semiconductor device of a same design as the DUT.

8. A semiconductor device burn-in (BI) stress system comprising:
   a controller including a computing device and a non-transitory computer readable storage medium in communication with the computing device;
   a burn-in board (BIB) including a plurality of BIB contacts each arranged to provide power from a power source to a respective contact of a semiconductor device under test (DUT) responsive to the controller;
   a control structure including a plurality of control devices each arranged to adjust power received at a respective DUT contact responsive to the controller; and
   a computer program product including instructions on the non-transitory computer readable storage medium in the form of computer executable code that when executed by the computing device configures the computing device to:
   deliver power to the DUT with the BIB according to a BI pattern;

virtually divide the DUT into a plurality of tiles each including a respective DUT contact, wherein the BI pattern includes a first portion of the DUT different than a second portion of the DUT;

determine a BI stress parameter value and allowable range thereof for each tile, wherein the BI pattern includes applying a different BI stress parameter profile to the first portion of the DUT than to the second portion of the DUT and wherein the applying of the different BI stress parameter profile includes taking the BI stress parameter value of each of at least one tile in the second portion into account in the applying of the BI stress parameter profile of the first portion;

identify any tile with a BI stress parameter value outside of the respective allowable range as a deviant tile; and responsive to a deviant tile having been identified, adjust the control structure such that the respective BI stress parameter can be at least closer to the respective allowable range, and repeat the delivering of power, the virtually dividing of the DUT, the determining of BI stress parameter values, the identifying, and the respective action responsive to the identifying.

9. The semiconductor device burn-in (BI) stress system of claim 8, wherein the plurality of control devices includes at least one power gate and the adjusting of the control structure includes changing a control voltage applied to the power gate.

10. The semiconductor device burn-in (BI) stress system of claim 8, wherein the BI stress parameter includes temperature, and the adjusting of the control structure includes adjusting at least one of a current, a voltage, or a power delivered to any deviant tile to a value within respective constraining values for the respective deviant tile that is determined to change the temperature of the deviant tile closer to the respective allowable temperature range.

11. The semiconductor device burn-in (BI) stress system of claim 8, wherein the applying of a different BI stress parameter profile includes inducing higher stress in the first portion than in the second portion.

12. The semiconductor device burn-in (BI) stress system of claim 8, wherein the applying of the different BI stress parameter profile includes changing the BI stress parameter profile of the first portion in a first manner and changing the BI stress parameter profile of the second portion in a second manner, thereby changing the BI stress parameter profile over the sum of the first and second portions to be substantially uniform.

13. The semiconductor device burn-in (BI) stress system of claim 8, wherein the taking the respective BI stress parameter value of each of at least one tile in the second portion into account includes determining a voltage drop between each of the at least one tile in the second portion and at least one tile of the first portion.

14. A semiconductor device burn-in (BI) stress design structure configured for inclusion in a device under test (DUT) and stored in a system comprising a computer and program instructions which, when executed, cause the computer to execute the program instructions by a machine used in design, manufacture, or simulation of an integrated circuit, comprising:

the machine manufacturing the design structure, comprising:

a plurality of input contacts each configured for electrical communication with a respective contact of a burn-in board (BIB) arranged to provide power to the BIB contact responsive to a controller;

a control structure including a plurality of control devices each between a respective input contact and a respective DUT contact and configured to adjust power received at the respective input contact to an adjusted value at the respective DUT contact responsive to a computing device;

a non-transitory computer readable storage medium configured for communication with the computing device; and a computer program product including instructions stored on the non-transitory computer readable storage medium in the form of computer executable code that when executed by the computing device configures the computing device to:

configure the BIB to provide power to the DUT according to a BI pattern;

virtually divide the DUT into a plurality of tiles each associated with a respective BIB contact and a respective control device of the control structure, wherein the BI pattern includes a first portion of the DUT different than a second portion of the DUT;

determine a BI stress parameter value and an allowable range thereof for each tile, wherein the BI pattern includes applying a different BI stress parameter profile to the first portion of the DUT than to the second portion of the DUT and wherein the applying of the different BI stress parameter profile includes taking the BI stress parameter value of each of at least one tile in the second portion into account in the applying of the BI stress parameter profile of the first portion; and identify any tile with a BI stress parameter value outside of the respective allowable range as a deviant tile; and responsive to a deviant tile having been identified, adjust the control structure such that the BI stress parameter of any deviant tile will be at least closer to the respective allowable range, and repeat the virtually dividing of the DUT, the determining of the BI stress parameter values, the identifying any deviant tile, and the respective action responsive to identification of any deviant tile.

15. The semiconductor device burn-in (BI) stress design structure of claim 14, wherein the design structure comprises a netlist.

16. The semiconductor device burn-in (BI) stress design structure of claim 14, wherein the design structure resides on non-transitory storage medium as a data format used for an exchange of layout data of integrated circuits.

17. The semiconductor device burn-in (BI) stress design structure of claim 14, wherein the design structure resides in a programmable gate array.

* * * * *